United States Patent [19]

Kim et al.

[11] Patent Number: 5,796,079

[45] Date of Patent: Aug. 18, 1998

[54] RAPID THERMAL PROCESSING METHOD FOR FERROELECTRIC, HIGH DIELECTRIC, ELECTROSTRICTIVE, SEMICONDUCTIVE, OR CONDUCTIVE CERAMIC THIN FILM USING MICROWAVES

[75] Inventors: Tae Song Kim; Hyung Jin Jung, both of Seoul; Do Kyung Kim; Yoon Chang Kim, both of Daejeon, all of Rep. of Korea

[73] Assignee: Korea Institute of Science and Technology, Seoul, Rep. of Korea

[21] Appl. No.: 757,859

[22] Filed: Nov. 27, 1996

[30] Foreign Application Priority Data

Jul. 16, 1996 [KR] Rep. of Korea ............... 28713/1996

[51] Int. Cl.⁶ ............................................. H05B 6/68
[52] U.S. Cl. .................. 219/678; 219/711; 219/762; 118/725; 118/723 MW; 427/595
[58] Field of Search .................. 219/710, 711, 219/712, 679, 762, 713, 678, 690; 118/724, 725, 728, 723 MW; 427/591, 595

[56] References Cited

U.S. PATENT DOCUMENTS

| 4,622,447 | 11/1986 | Inoue | 219/678 |
|---|---|---|---|
| 4,683,363 | 7/1987 | Scovell | 219/762 |
| 4,963,709 | 10/1990 | Kimrey, Jr. | 219/710 |
| 5,036,172 | 7/1991 | Kokkeler et al. | 219/710 |
| 5,124,179 | 6/1992 | Garg et al. | 427/249 |
| 5,417,494 | 5/1995 | Kempa et al. | 219/711 |
| 5,459,302 | 10/1995 | Jacqualt | 219/711 |

OTHER PUBLICATIONS

C.V.R. Vasant Kumar, et al., "Crystallization of sputtered lead zirconate titanate films by rapid thermal processing," *J. Appl. Phys.*, 71(2), 15 Jan. 1992, pp. 864–874.

S.-L. Zhang, et al., "Rapid thermal processing with microwave heating," *Thin Solid Films*, 246 (1994) pp. 151–157.

Willard H. Sutton, "Microwave Processing of Ceramic Materials," *Ceramic Bulletin*, vol. 68, No. 2, 1989, pp. 376–386.

*Primary Examiner*—Philip H. Leung
*Attorney, Agent, or Firm*—McDermott, Will & Emery

[57] ABSTRACT

A rapid thermal processing method for a ceramic thin film which is capable of carrying out a uniform heating of a large sized wafer, and of achieving a rapid temperature elevation, and of enhancing a crystallinity of a deposited thin film, wherein a thin film-coated material is disposed on a support to rapidly heat the thin film by the application of microwaves, the temperature is measured with a temperature measuring unit, and the generation of the microwaves is halted at a required temperature.

8 Claims, 3 Drawing Sheets

5,796,079

RAPID THERMAL PROCESSING METHOD FOR FERROELECTRIC, HIGH DIELECTRIC, ELECTROSTRICTIVE, SEMICONDUCTIVE, OR CONDUCTIVE CERAMIC THIN FILM USING MICROWAVES

BACKGROUND OF THE INVENTION

1. Field of the Invention

The present invention relates to a rapid thermal processing for a ferroelectric, high dielectric, electrotrictive, semiconductive, or conductive ceramic thin film by using microwaves, and in particular, a rapid thermal processing for a ferroelectric thin film used for a nonvolatile ferroelectric random access memory (NVFeRAM.NVFRAM) or a device in which the piezoelectricity, superconductivity, or nonlinear optical property of a ferroelectric thin film are utilized, an electrostrictive material used for the manufacture of an actuator and a sensor having an electrostrictive characteristic or an $SrTiO_3$ $Ba_xSr_{1-x}TiO_3$ thin film used as a capacitor for a highly integrated memory circuit such as 1 Giga bit DRAM.

2. Description of the Conventional Art

For example, the high dielectric constant, excellent piezoelectricity and pyroelectric property, and superior optical quality of a $Pb(Zr_{1-x}Ti_x)O_3$(hereinafter, called PZT) type ferroelectric thin film enables the thin film to be utilized in a DRAM(dynamic random access memory) device, a microactuator, an infrared sensor, and an optical device, and recently, the ferroelectric thin film has been chiefly used as a material for the NVFRAM along with a rapid development in a semiconductor process technique.

In order to be used as a capacitor for a NVFRAM, the ferroelectric thin film must have a high value of residual polarization, a low value of leakage current, invariable values of residual and spontaneous polarizations with respect to time, a good fatigue characteristic, and a low dielectric loss.

Such compounds containing a Pb element as PZT and PLZT, and many kinds of lamellar compounds ($SrBi_2Ta_2O_9$, $SrBi_2Nb_2O_9$, $SrBi_2(Ta,Nb)_2O_9$, $BaBi_2Ta_2O_9$, $Bi_4Ti_3O_{12}$) produce a ferroelectric thin film which has been used as a material for the NVFRAM so far, and the methods for fabricating an excellent characteristic thin film include a sputtering, a sol-gel, an MOD (metallorganic decomposition), a laser ablation, an MOCVD, and LSCVD, which are widely used.

However, when the above methods are adopted, the controlling of the material composition is not easy, and in particular, a thin film containing a volatile Pb or Bi compound is much more difficult to be deposited. Since the composition control becomes more difficult as the temperature of a substrate is elevated in fabricating a thin film, a thin film is better deposited at a low temperature. Further, since an oxygen vacancy or a Pb plus ion vacancy existing at a boundary surface contacted with an electrode forms a space charge layer, a switching characteristic that a voltage direction is periodically varied is lowered.

However, if a deposition at a low temperature is not easy to perform, that is, if the temperature of a substrate is elevated up to a predetermined degree and a thermal processing is to be carried out, a post thermal processing is required, which is an important technique because there occurs a problem in a reaction at a boundary surface such as a mutual diffusion between a substrate and a ferroelectric thin oxide film. In particular, when a thin film is fabricated as a part of a large scale integrated circuit process by adopting a conventional semiconductor process, such a device as a transistor already formed is apt to be influenced by heat during a thermal processing, and there is a possibility of mechanical defects owing to the difference between coefficients of expansion of an elelctrode used or a barrier material.

As a post thermal processing, a radiant rapid thermal processing using a quartz tungsten halogen lamp has been employed so far. A number of halogen lamps are disposed in a thermal chamber arrayed opposite to each other with half in an upper section and another half in a lower section, and a wafer is put between the lamp array. A support for the above element is composed of quartz. The light of the upper lamps is absorbed into the upper surface of the wafer, and the light of the lower lamps is absorbed into the bottom surface of the wafer. The temperature is elevated up to the point that the absorbed power is identical to the radiant power. When power is turned off, that is, when the lamps are turned off, the wafer emits heat by radiation, and the temperature of the wafer decreases.

However, according to the above-described rapid thermal processing by thermal radiation, it is difficult to keep the temperature constant, and when a wafer of over eight inch generally used in a present semiconductor process is thermally processed, it is almost impossible to perform a uniform heating on the material.

SUMMARY OF THE INVENTION

Accordingly, it is an object of the present invention to provide a novel and useful rapid thermal processing for a ceramic thin film which is capable of uniformly heating a wafer although the wafer is of a large size, of rapidly increasing the temperature, and of improving a crystallinity of a deposited thin film.

To achieve the above object, there is provided a rapid thermal processing method for a ferroelectric, high dielectric, electrotrictive, semiconductive, or conductive ceramic thin film using microwaves in which a thin film-coated material is disposed on a quartz support to rapidly heat the thin film by the application of microwaves, the temperature is measured with a temperature measuring unit, and the generation of the microwaves is halted at a required temperature.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
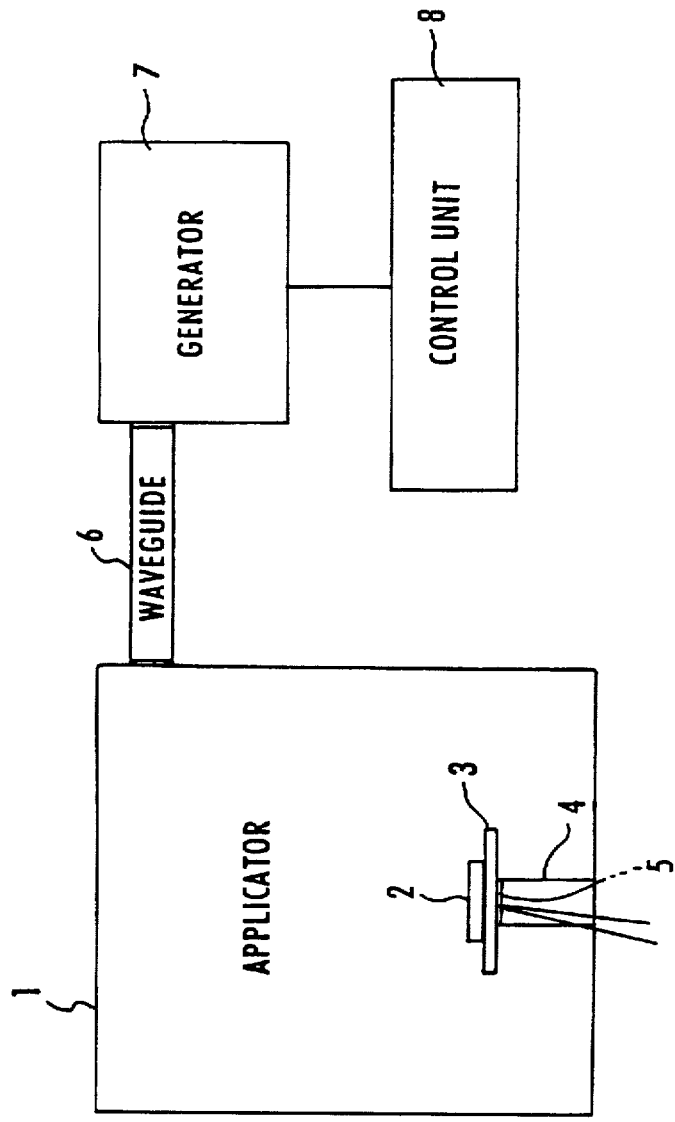
FIG. 1 is a schematic view of a microwave applying apparatus employed in the present invention.

According to the method of using microwaves, among 400 MHz to 40 GHz which is an ISM(Interational Science and Medicine) frequency band allotted for private use, 2.45 GHz is used as a frequency appropriate to the sintering of ceramics, but sometimes 28 GHz and 60 GHz are also used.

The application of microwaves in the fabrication process of ceramics will now be described in detail.

Microwaves are adapted to a processing control in nondestructive inspection, or to a powder synthesis or a sintering by generating a plasma. Furthermore, microwaves make rapid the dissolution speed of a mineral in a solution to be used for the shortening of a wet chemical analysis or to be employed as a thermal source in sintering, bonding and melting ceramics.

The principles of heating a material by using microwaves which have been known so far are as follows:

When microwaves are applied to each different material, the degree of penetration, absorption or reflection occurs differently according to the kind and temperature of the materials. Since microwaves are unable to permeate most metals and are reflected, the metals cannot be heated. On the other hand, microwaves are able to pass through most ceramic dielectric materials (electrical insulating materials) such as $Al_2O_3$, MgO, $SiO_2$ at room temperature, but when the above materials are heated over a critical temperature, they carry out a gradual coupling with microwave energy so that they can absorb it effectively. A conductive or magnetic material such as $Co_2O_3$, $MnO_2$, NiO, $Fe_2O_3$, CuO and a carbon black begins to absorb microwaves at a room temperature. When these materials absorbing microwaves are added to microwave-penetrable ceramic materials in the shape of a fiber or a particle, a selective heating occurs such that they react with microwaves faster than in a matrix, resulting in increasing the effect that the whole material absorbs the microwave energy.

The phenomenon that when microwave energy is applied to a material the material is heated thereby can be explained by dielectric loss resulting from a polarization. The polarization agents of the material include an electronic, atomic or ionic, dipole or orientation, and a space charge polarization.

Which polarization agent can effectively function depends on the kind of material and the frequency and temperature of the electromagnetic waves. In the microwave frequency range, an electronic polarization can mainly function in a macromolecular material, and the space charge polarization occurs at a relatively low frequency and at a boundary region with other materials. An exothermic phenomenon occurring within a frequency range of 10 GHz is caused by the atomic and dipole polarizations, among which the dipole polarization is a main agent for the exothermic phenomenon.

When an electrical field is applied to a ceramic dielectric body in which dipoles are disorderly arranged, the dipoles in the electric field tend to be oriented in the opposite direction of the electric field. When the dipoles are oriented in such a direction, since an electric field is generated by the dipoles in the opposite direction to the external electric field, an internal electric field is reduced. But, when a rapidly changing electric field occurring at a frequency of 1 GHz corresponding to a microwave region is applied to the ceramic, a dipole which is a physical entity with a mass and an inertia can not catch up with the changing speed of an electric field, and as a result, potential energy is accumulated. The potential energy is converted into a random kinetic energy, which is emitted in the form of heat to the ceramics.

As described above, the absorption and permeation of microwaves in a material depend on a dielectric characteristic of the material. Therefore, to understand and predict an exothermic characteristic of a material by microwaves, the dielectric characteristics of the material and the factor causing the characteristic must be understood. In a process of heating with microwaves, the rate of temperature elevation is determined by the temperature, an effective loss factor and a field strength.

Generally, while the ceramic is heated by microwaves from a room temperature to a sintering temperature, its thermal capacity and density are doubled, but the loss factor is increased up to over 10 times. Therefore, to control the loss factor of a heated material is the most important thing in a thermal process using microwaves. And, since the thermal loss is rapidly increased by radiation at a high temperature region in which a sintering is performed, an adiabatic construction is also required.

When a material reaches a critical temperature while being heated using microwaves, tan $\partial$ (dielectric loss) is rapidly increased, and the temperature is also rapidly elevated. When the tan $\partial$ is rapidly increased, the material absorbs microwave energy more effectively, resulting in elevating its temperature. Then, the temperature elevation increases tan a much faster again.

By a series of accelerating effects, a exponential increase of the temperature is caused, which is called a thermal runaway. The temperature at which the thermal runaway develops is dependent upon each material. Description of the thermal runaway condition on which the exponential increase of the temperature arises will be given, taking two kinds of materials, for example.

Since an A-type material has a low tan $\partial$ at a normal temperature, the thermal runaway does not develop in an output range applied to a B-type material, but when an output is elevated sufficiently, an absorption efficiency is increased accordingly, resulting in the development of the thermal runaway. The B-type material absorbs microwaves at room temperature effectively, and the application of a predetermined output of microwave energy to a sample causes the thermal runaway to occur rapidly. The initial heated shape of $Cr_2O_3$ is similar to the A-type material, and that of $Fe_3O_4$ to the B-type material.

The thermal runaway plays an important role in heating by microwaves. The basic reason is a rapid temperature elevation, and when a material is not uniform, the generation of an undesirable hot spot and melting in a local section causes a thermal shock, resulting in the destruction of the material. Therefore, special care is required in sintering ceramics.

FIG. 1 is a schematic view of a microwave applying apparatus employed in the present invention which includes a generator 7 for generating microwave an applicator 1 used as a chamber for interacting a material and microwave, a waveguide section 6 for transmitting and adjusting the generated microwave by connecting the generator 7 and the applicator 1 and a control unit 8 for controlling the generation of the microwave energy.

The microwave applying apparatus employs a multimode applying method, wherein the simple structure and the easy manufacture advantageously enable the apparatus to not be influenced by the size of the material to be applied. However, when the number of modes created in the applicator is small even though it is composed of multimode, the distribution of the electric field is disadvantageously rendered irregular. To solve this defect, the parts having a different size of an electric field are allowed to pass at a constant speed by using a rotary platen, or several modes are allowed to be created simultaneously by stirring an electric field of the portion to which microwaves are incident in the applicator by an irregular reflection with a propeller-shaped mode agitator.

A fused quartz which the microwave is transmitted and can safely endure at a high temperature is used as a support 4, and thereon, a silicon substrate is placed as a substrate support 3 as in a rapid heating apparatus using a general radiation heating and a substrate 2 deposited with the ceramic thin film is placed on the substrate support 3. When a rapid thermal processing is carried out on a large size wafer having a diameter of over 1 to 2 inches, the self rapid thermal processing can be performed without the need of a silicon substrate support.

When the substrate support 3 is used, the temperature can be measured by etching the back surface of silicon wafer, by inserting a small thermocouple tip(a bead-shaped tip) 5 therein, and fixing the same with a conductive adherent(for example, Ag paste etc.). Then a shielding is performed on the surface of the thermocouple line to prevent its reaction with microwave energy.

Another method of measuring the temperature is to stack two sheets of silicon wafers on the support, to minimize the space between the stacked wafers to be smaller than the wavelength of the microwaves, to insert a thermocouple bead therebetween and then fix the same with a conductive adherent. Here, a shielding is also performed on the surface of the thermocouple line to prevent its reaction with microwaves.

Still another method of measuring the temperature is to sense a wafer temperature by a non-contact method, using an optical fiber-type small pyrometer. Here, since the optical fiber itself is composed of quratz and does not react with microwaves, it can be easily fused.

When processing a large sized wafer, which obviates the necessity of a silicon substrate support, that is, when there is no substrate support on which a thermocouple can be disposed, a wafer for measuring a temperature on which a thermocouple is affixed must be provided or a pyrometer must be equipped. When the optical fiber pyrometer is used to read the temperature, since the film for undergoing a thermal processing is deposited on the front surface of the wafer, the pyrometer must be disposed to read the back surface of the wafer.

When a thin film is coated in which a thermal runaway does not develop or the development degree is not satisfactory although the material is exposed to microwaves in a thermal processing, a rapid heating using microwaves is difficult to carry out. Therefore, if a material in which a thermal runaway easily develops is used as a substrate on which a thin film is to be coated, it must be selected to allow a rapid heating of the substrate to be easily rendered, resulting in achieving the effect of the thermal processing of the coated thin film thereon.

Figure 2:
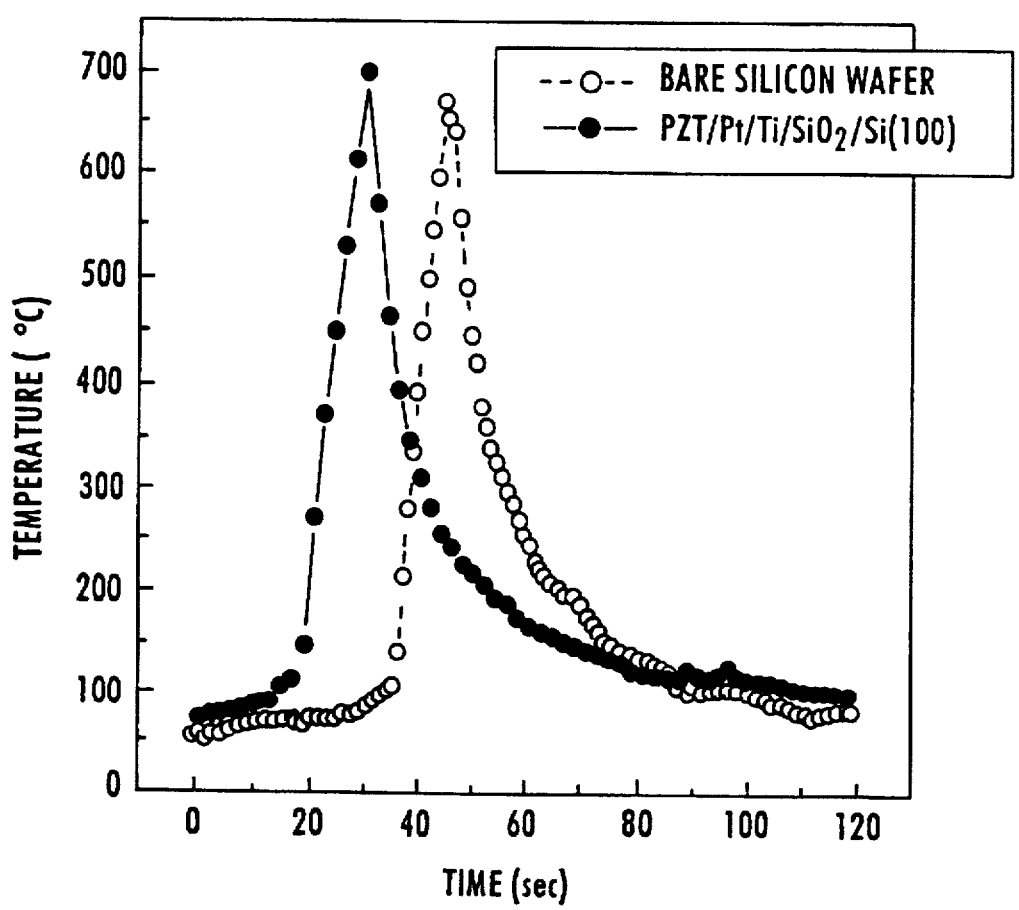
FIG. 2 is a graph showing a temperature change with respect to a thermal processing time for the purpose of observing a suscetpibility of a rapid thermal processing of a material used in an embodiment of the present invention.

FIG. 2 is a graph showing a temperature change with respect to time in a thermal processing for the purpose of observing a susceptibility for a rapid thermal processing of a material used in an embodiment of the present invention.

The materials used in the experiment were a bare silicon wafer and a $Pb(Zr_{0.52}Ti_{0.48})O_3$ thin film having a thickness of 4000 Å deposited on a $Pt/Ti/SiO_2/Si(100)$ substrate at a substrate temperature of 420° C. by a sputtering method. In the case of a bare silicon substrate, when about forty seconds passes after microwave energy is applied, the temperature reaches a peak within 5 minutes, and in the case of the substrate on which a PZT thin film is deposited, the temperature starts to increase after twenty seconds, and reaches a point to be thermally processed within about five seconds.

As mentioned above, in case a rapid thermal processing is carried using microwaves, a temperature increase rate of about 120° C. per second can be obtained, and the increasing rate can be controlled in accordance with the applied power to the microwave oven. The above-described rapid increase of the temperature shows a susceptibility or amenability for a rapid thermal processing.

Figure 3:
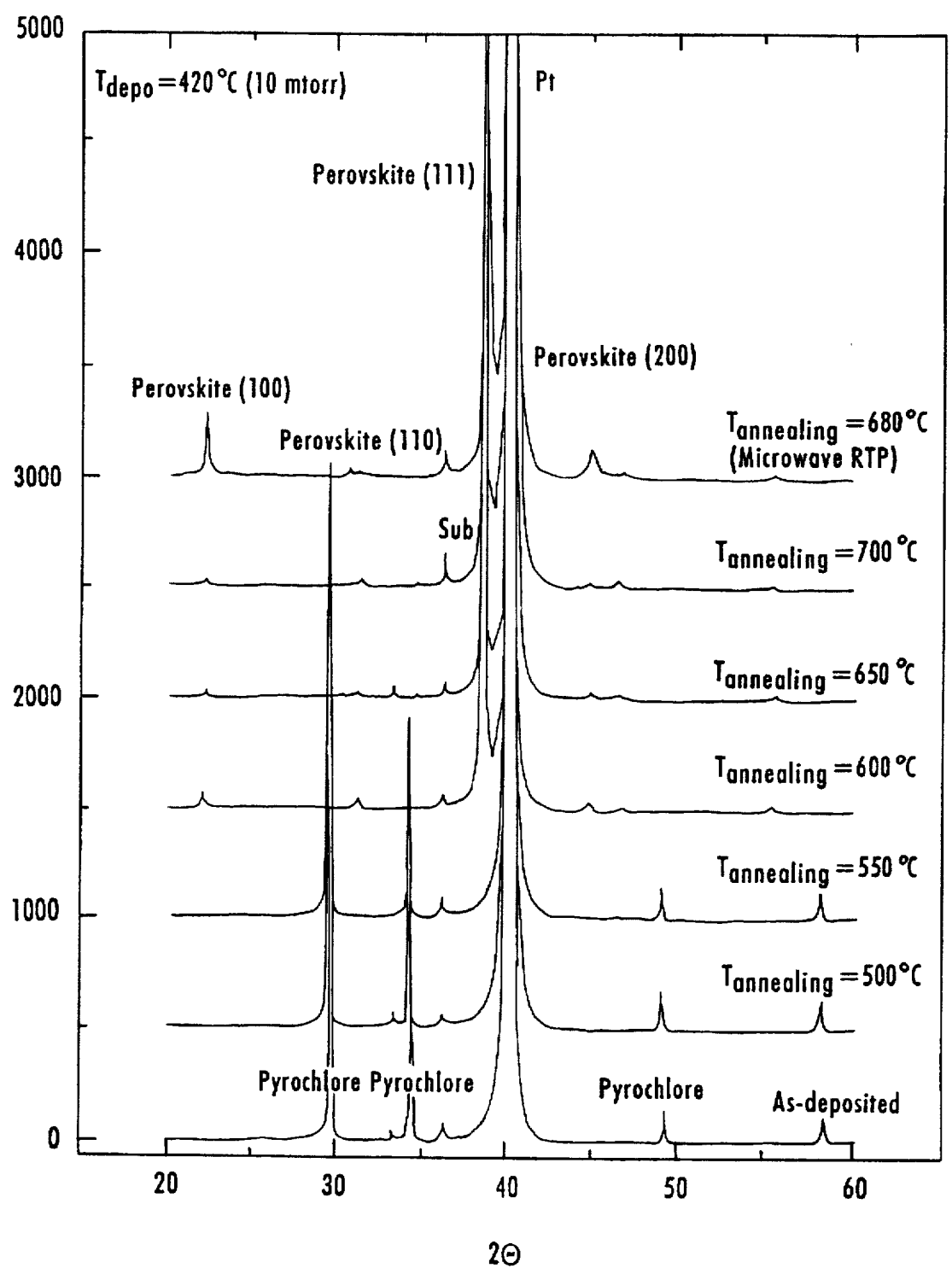
FIG. 3 is an X-ray diffraction (XRD) pattern showing the degree of crystallinity of a PZT thin film resulting from a rapid thermal processing schedule in FIG. 2.

FIG. 3 is an XRD pattern showing the degree of crystallinity of a PZT thin film resulting from the rapid thermal processing schedule in FIG. 2.

The XRD patterns are those of an As-deposited thin film at 420° C., of a thin film of which a thermal processing was performed at 500° to 700° C. and of a thin film of which a thermal processing was performed at 680° C. by microwaves. When comparing the patterns with each other, the thermal processing at 680° C. by microwaves has a better effect than any other processing. In the processing at 680° C., a rapid increase of PZTs (100)(200) peak can be observed, and the increasing width is incomparably large in comparison with the case of the processing at 700° C. Therefore, the crystallinity of the deposited thin film has been increased by the rapid thermal processing using microwaves according to the present invention.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A rapid thermal processing method for a ferroelectric, high dielectric, electrotrictive, semiconductive, or conductive ceramic thin film using microwaves, which method comprising:

disposing a material deposited with the ceramic thin film on a first supporting means;

applying microwaves uniformly on the material and heating the material deposited with the ceramic thin film rapidly;

measuring a temperature of the material by using a temperature measuring means; and halting the generation of the microwaves when the temperature of the material reaches a desired temperature.

2. The method of claim 1, comprising:

disposing a second support means for the material on the first supporting means and placing the material on the second supporting means.

3. The method of claim 2, comprising:

etching a back surface of the second supporting means; and inserting a thermocouple as the temperature measuring means therein to measure the temperature.

4. The method of claim 3, wherein the thermocouple has a shielded thermocouple line.

5. The method of claim 2, comprising:

stacking the second supporting means no less than two folds; and inserting a thermocouple as the temperature measuring means between the folded second supporting means to measure the temperature.

6. The method of claim 5, wherein the thermocouple has a shielded thermocouple line.

7. The method of claim 1, wherein the temperature measuring means is a pyrometer.

8. The method of claim 1, wherein the heating is carried out under a thermal insulation condition by surrounding the material with insulation materials.

\* \* \* \* \*